United States Patent
Kozlov et al.

(10) Patent No.: US 11,652,491 B2
(45) Date of Patent: May 16, 2023

(54) HIGH-PASS SHAPED DITHER IN CONTINUOUS-TIME RESIDUE GENERATION SYSTEMS FOR ANALOG-TO-DIGITAL CONVERTERS

(71) Applicant: Analog Devices International Unlimited Company, Limerick (IE)

(72) Inventors: Victor Kozlov, Toronto (CA); Donald W. Paterson, Winchester, MA (US); Sharvil Pradeep Patil, Toronto (CA); Hajime Shibata, Toronto (CA)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/390,852

(22) Filed: Jul. 30, 2021

(65) Prior Publication Data
US 2022/0045686 A1 Feb. 10, 2022

Related U.S. Application Data

(60) Provisional application No. 63/062,597, filed on Aug. 7, 2020.

(51) Int. Cl.
*H03M 1/20* (2006.01)
*H03M 1/06* (2006.01)

(52) U.S. Cl.
CPC .................. *H03M 1/0641* (2013.01)

(58) Field of Classification Search
CPC .... H03M 1/164; H03M 1/167; H03M 1/1009; H03M 1/145; H03M 1/0626; H03M 1/12;
(Continued)

(56) References Cited

U.S. PATENT DOCUMENTS 6,016,113 A * 1/2000 Binder .................. H03M 1/207
 341/131
6,173,003 B1 * 1/2001 Whikehart ............... H04B 1/10
 708/250
(Continued)

FOREIGN PATENT DOCUMENTS

EP 2381578 10/2011

OTHER PUBLICATIONS

Shibata et al., *A 9-GS/s 1.125-GHz BW Oversampling Continuous-Time Pipeline ADC Achieving—164-dBFS/Hz NSD*, IEEE Journal of Solid-State Circuits, vol. 52, No. 12, Dec. 2017, 16 pages.
(Continued)

*Primary Examiner* — Linh V Nguyen
(74) *Attorney, Agent, or Firm* — Schwegman Lundberg & Woessner, P.A.

(57) ABSTRACT

Mechanisms for reducing or eliminating a quantization error caused by a quantizer of a continuous-time (CT) residue generation system are disclosed. In particular, systems and methods described herein are based on using a dither generation and injection circuit that can perform a high-pass filtering of the additive dither signal (i.e., a high-pass shaped dither signal). Using high-pass shaped dither signals is expected to improve quantizer linearity without significantly reducing the available error correction range. The applied dither may be particularly effective at minimizing signal-dependent distortion in ADC output spectrum caused by the quantizer when the quantization error cancellation accuracy may be insufficient.

20 Claims, 14 Drawing Sheets

(58) Field of Classification Search
CPC ...... H03M 1/001; H03M 1/0641; H03M 1/44; H03M 1/1038; H03M 1/06; H03M 1/201; H03M 1/1057; H03M 1/66; H03M 1/1023; H03M 1/0639
USPC ........ 341/138–140, 118–120, 155, 161, 162, 341/131
See application file for complete search history.

(56) References Cited

U.S. PATENT DOCUMENTS

| | | | | |
|---|---|---|---|---|
| 6,268,814 | B1* | 7/2001 | Kolsrud | H03M 1/0641 |
| | | | | 341/131 |
| 6,489,904 | B1* | 12/2002 | Hisano | H03M 1/1061 |
| | | | | 341/161 |
| 6,880,262 | B1 | 4/2005 | Jensen | |
| 7,015,851 | B1* | 3/2006 | Bruhns | H03M 1/0641 |
| | | | | 341/131 |
| 7,411,534 | B1 | 8/2008 | Melanson | |
| 7,580,157 | B2 | 8/2009 | Wei | |
| 7,876,247 | B1* | 1/2011 | Hunt | H03M 7/3008 |
| | | | | 341/131 |
| 8,766,836 | B2 | 7/2014 | Maurino et al. | |
| 8,779,963 | B1* | 7/2014 | Bales | H03M 1/007 |
| | | | | 341/161 |
| 8,896,475 | B2 | 11/2014 | Shibata | |
| 9,312,840 | B2* | 4/2016 | Dong | H03M 1/0626 |
| 9,432,045 | B2 | 8/2016 | Shibata | |
| 9,595,974 | B1* | 3/2017 | Pereira | H03M 1/164 |
| 9,667,267 | B2* | 5/2017 | Wang | H03M 1/201 |
| 9,768,793 | B2* | 9/2017 | Meng | H03M 1/124 |
| 9,929,738 | B2 | 3/2018 | Straeussnigg | |
| 10,171,102 | B1 | 1/2019 | Shibata et al. | |
| 10,187,075 | B1* | 1/2019 | Patil | H03M 1/001 |
| 10,432,210 | B1 | 10/2019 | Yendluri et al. | |
| 2005/0275578 | A1* | 12/2005 | Bjornsen | H03M 1/0641 |
| | | | | 341/155 |
| 2008/0055651 | A1* | 3/2008 | Wei | G06F 7/58 |
| | | | | 358/1.9 |
| 2008/0238754 | A1 | 10/2008 | Knudsen | |
| 2013/0207820 | A1* | 8/2013 | Maurino | H03M 3/328 |
| | | | | 341/131 |
| 2014/0104086 | A1* | 4/2014 | Zhang | H03M 1/1023 |
| | | | | 341/120 |
| 2015/0138006 | A1* | 5/2015 | Straeussnigg | H03M 1/164 |
| | | | | 341/155 |
| 2017/0041013 | A1* | 2/2017 | Nagarajan | H03M 1/0641 |
| 2019/0131992 | A1* | 5/2019 | Ali | H03M 1/0687 |

OTHER PUBLICATIONS

Gubbins et al., *Continuous-Time Input Pipeline ADCs*, IEEE Journal of Solid-State Circuits, vol. 45, No. 8, Aug. 2010, 13 pages.
O'Hare et al., *Bandwidth Enhancement to Continuous-Time Input Pipeline ADCs*, IEEE Transactions on Very Large Scale Integration (VLSI) Systems, vol. 26, No. 2, Feb. 2018, 12 pages.
Shen et al., *A 0.01mm2 25μW 2MS/s 74dB-SNDR Continuous-Time Pipelined-SAR ADC with 120fF Input Capacitor*, ISSCC 2019, Session 3, Nyquist Rate ADC, 3.4, 3 pages.
Shen et al., *A Two-Step ADC with a Continuous-Time SAR-Based First Stage*, IEEE Journal of Solid-State Circuits, vol. 54, No. 12, Dec. 2019, 11 pages.
Lipshitz et al., *Quantization and Dither: A Theoretical Survey*, J. Audio Eng. Soc., vol. 40, No. 5, May 1992, 21 pages.
Norsworthy, *Effective Dithering of Sigma-Delta Modulators*, IEEE International Symposium on Circuits and Systems, May 10-13, 1992, Publication and Abstract included, 6 pages.
Ghosh et al., *Linearization Through Dithering: A 50 MHz Bandwidth, 10-b ENOB, 8.2 mW VCO-Based ADC*, IEEE Journal of Solid-State Circuits, vol. 50, No. 9, Sep. 2015, 13 pages.
Wannamaker et al., *A Theory of Nonsubtractive Dither*, IEEE Transactions on Signal Processing, vol. 48, No. 2, Feb. 2000, 18 pages.

\* cited by examiner $$V = A[z] \cdot V_1 + B[z] \cdot V_2$$
$$V = A[z] \cdot V_1 + B[z] \cdot H[z] \cdot V_1$$
$$V = A[z] \cdot e_1 + B[z] \cdot H[z] \cdot e_1$$
$$V = (A[z] + B[z] \cdot H[z]) \cdot e_1$$

FIG. 2

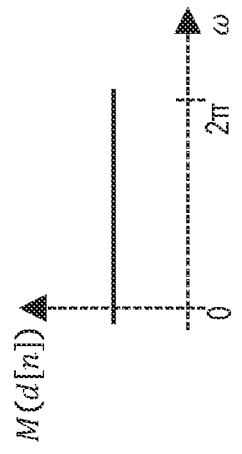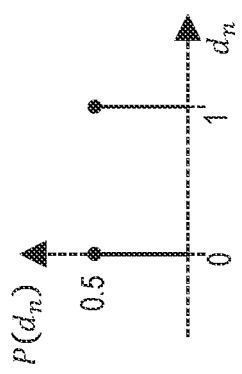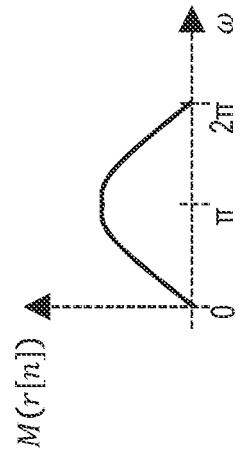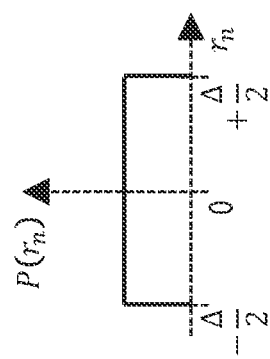
FIG. 6A
FIG. 6B
FIG. 6C
FIG. 6D

HIGH-PASS SHAPED DITHER IN CONTINUOUS-TIME RESIDUE GENERATION SYSTEMS FOR ANALOG-TO-DIGITAL CONVERTERS

PRIORITY DATA

This patent application claims priority to and receives benefit from U.S. Provisional Application Ser. No. 63/062,597, titled "HIGH-PASS SHAPED DITHER IN CONTINUOUS-TIME RESIDUE GENERATION SYSTEMS FOR ANALOG-TO-DIGITAL CONVERTERS", filed on Aug. 7, 2020. The US Provisional application is hereby incorporated in its entirety.

TECHNICAL FIELD OF THE DISCLOSURE

The disclosure relates generally to analog-to-digital converters and, more particularly, to analog-to-digital converters that employ continuous-time (CT) residue generation architecture.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are referred to as analog-to-digital converters (ADCs). ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost, and size. As the applications needing ADCs grow, the need for accurate and reliable conversion performance also grows.

BRIEF DESCRIPTION OF THE DRAWINGS

To provide a more complete understanding of the disclosure and features and advantages thereof, reference is made to the following description, taken in conjunction with the accompanying figures, wherein like reference numerals represent like parts in which:

FIG. 2 provides four equations associated with the descriptions of FIG. 1B, according to some embodiments of the disclosure;

FIG. 6A provides a schematic illustration of the binomial probability distribution of the 1-bit pseudorandom signal d[n], according to some embodiments of the disclosure;

FIG. 6B provides a schematic illustration of the flat spectrum of a pseudorandom binary sequence (PRBS) generator output d[n], according to some embodiments of the disclosure;

FIG. 6C provides a schematic illustration of a uniform probability density function of the spectrally-shaped pseudorandom signal r[n] after sampling, according to some embodiments of the disclosure;

FIG. 6D provides a schematic illustration of the spectrum of samples of r[n], where the low-frequency power having been attenuated by the high-pass filter L(s), according to some embodiments of the disclosure;

DESCRIPTION OF EXAMPLE EMBODIMENTS OF THE DISCLOSURE

Overview

Figure 1A:
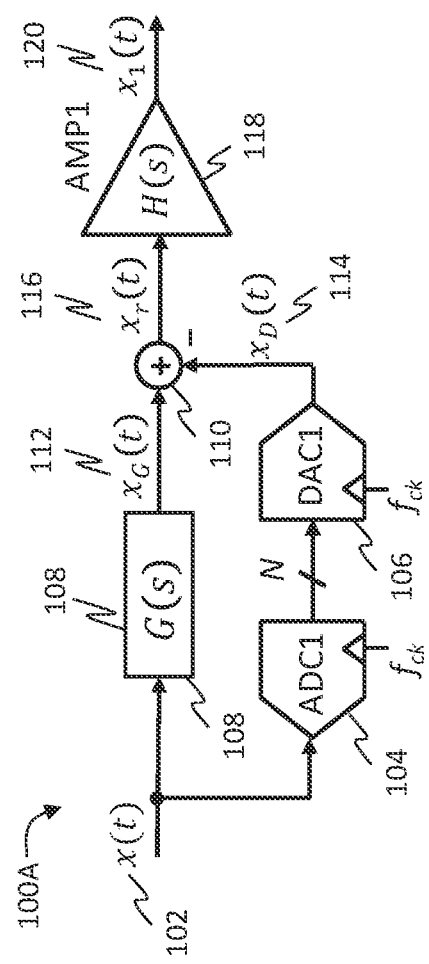
FIGS. 1A and 1B provide schematic illustrations of CT residue generation systems, according to some embodiments of the disclosure.

CT residue generation systems/stages (referred to herein as "systems") are increasingly popular in high-performance and high-speed ADCs, partly due to their inherent anti-aliasing and their potential to achieve high sampling rates. However, a quantizer of a CT residue generation system may add quantization error that may corrupt the output of the system. Mechanisms for reducing or eliminating a quantization error caused by a quantizer of a continuous-time (CT) residue generation system are disclosed. In particular, systems and methods described herein are based on using a dither generation and injection circuit that can perform a high-pass filtering of the additive dither signal (i.e., a high-pass shaped dither signal).

Dither signals described herein may be referred to as "high-pass shaped dither signals" or "high-pass shaped dither". Using high-pass shaped dither signals is expected to improve quantizer linearity without significantly reducing the available error correction range, because the filter processing a residue signal can be a low-pass filter. Other types of spectrally-shaped dither signals can be used to complement the filter response of the residue amplifier or achieve the desired effect of lowering the power of the filtered residue signal.

The applied dither may be particularly effective at minimizing signal-dependent distortion in ADC output spectrum (also sometimes referred to as "tones") caused by the quantizer (or an ADC incorporating such a system) when the quantization error cancellation accuracy may be insufficient.

Basics of ADCs and Challenges with Quantization Errors

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. Typically the quantization occurs through periodic sampling of the analog input signal. The result is a sequence of digital values (i.e., a digital signal) that represents conversion of a CT and continuous-amplitude analog input signal to a discrete-time (DT) or discrete-amplitude digital signal.

An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

ADCs based on CT residue generation systems are increasingly popular in high-performance and high-speed data converters, thanks to their inherent anti-aliasing and their potential to achieve high sampling rates. An example of a CT residue generation system 100 is shown in FIG. 1, according to some embodiments of the disclosure. As shown in FIG. 1, a CT analog input, x(t) 102 is provided to two parallel and different paths. A first path, which may be described as a "feedforward" path, includes a cascade of a quantizer (ADC1) 104 and a feedforward digital-to-analog converter (DAC) DAC1 106. A second path, which may be described as a "forward" path, includes a CT filter 108 having a transfer function G(s).

In the forward path, the CT filter 108 having analog transfer function G(s) is applied to the CT analog input x(t) 102 to generate an output signal $x_G(t)$ 112, a filtered or delayed version of CT analog input x(t) 102 The transfer function G(s) represents the frequency response of CT filter 108 having CT circuit components. Typically, the CT filter 108 delays the CT analog input signal x(t) 102, and may have a transfer function G(s) that provides substantially constant group delay over a range of input frequencies of interest. For instance, the delay of the CT filter may match the inherent delay in the feedforward path. CT circuit components may include one or more of transmission lines, shunt capacitors, series resistors, shunt resistor-capacitor circuits, shunt inductor-capacitor circuits, resistor-capacitor (RC) lattice delay lines, and inductor-capacitor (LC) lattice delay lines.

In the feedforward path, the CT analog input x(t) 102 is processed by circuitry which can include an N-bit ADC implementing the quantizer (ADC1) 104 and an N-bit DAC implementing the feedforward DAC (DAC1) 106. There may be other circuitry which is not explicitly shown besides ADC1 104 and DAC1 106. For instance, the feedforward path can include an analog filter upstream of ADC1 104. The feedforward path can include a digital filter upstream of DAC1 106. The quantizer 104 and feedforward DAC 106 may be clocked at a sampling rate of $f_{ck}$ in the feedforward path. Quantizer 104 generates a digital output $V_1[n]$ and the digital output $V_1[n]$ is provided as input to feedforward DAC 106 to generate an analog output signal $x_D(t)$ 114 (sometimes referred to as the reconstructed input signal). The analog output signal $x_D(t)$ 114 is a reconstructed version of the CT analog input x(t) 102.

In some cases, a subtractor 110 subtracts the output signal $x_G(t)$ 112 of CT filter 108 from the output $x_D(t)$ 114 of the feedforward DAC 106 to generate a residue signal $x_r(t)$ 116. Subtractor 110 can be implemented as a summation node, if the inputs to the summation node has the appropriate polarity to allow for differencing to occur. Instead of providing $x_D(t)$, $-x_D(t)$ can be provided to a summation node such that $x_D(t)$ can be subtracted from $x_G(t)$.

The CT residue generation system 100 may generate a filtered CT residue signal $x_1(t)$ by amplifying and/or filtering residue signal $x_r(t)$. The amplifying and/or filtering can be performed by a band-selective residue amplifier, filter H(s) 118. The filter H(s) 118 operates on the difference of a time-delayed input signal x(t) (i.e., $x_G(t)$) and a reconstructed version or approximation of the input signal (i.e., $x_D(t)$), as processed by a quantizer 104 and injected by the feedforward DAC 106. Therefore, the residue amplifier may also be referred to as a "residue filter H(s)." For example, in low-pass ADCs used in zero intermediate frequency (IF) and low-IF radio receivers, the transfer function of the filter 118 may be a low-pass filter.

Figure 1B:
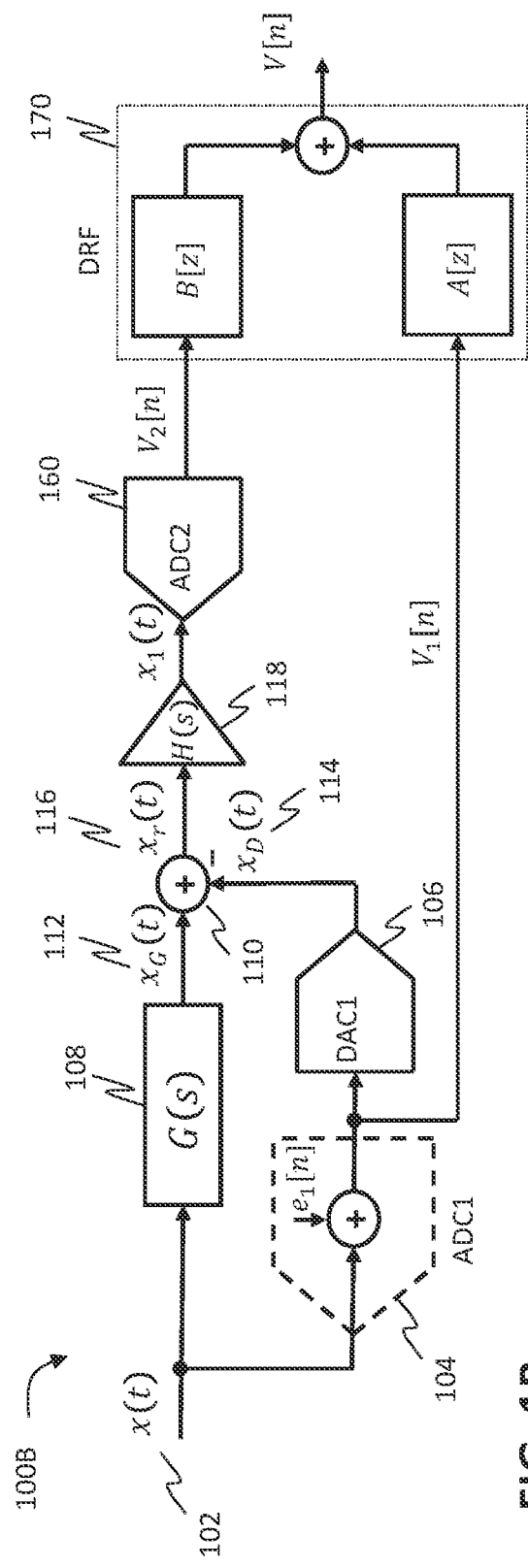
Figure 13:
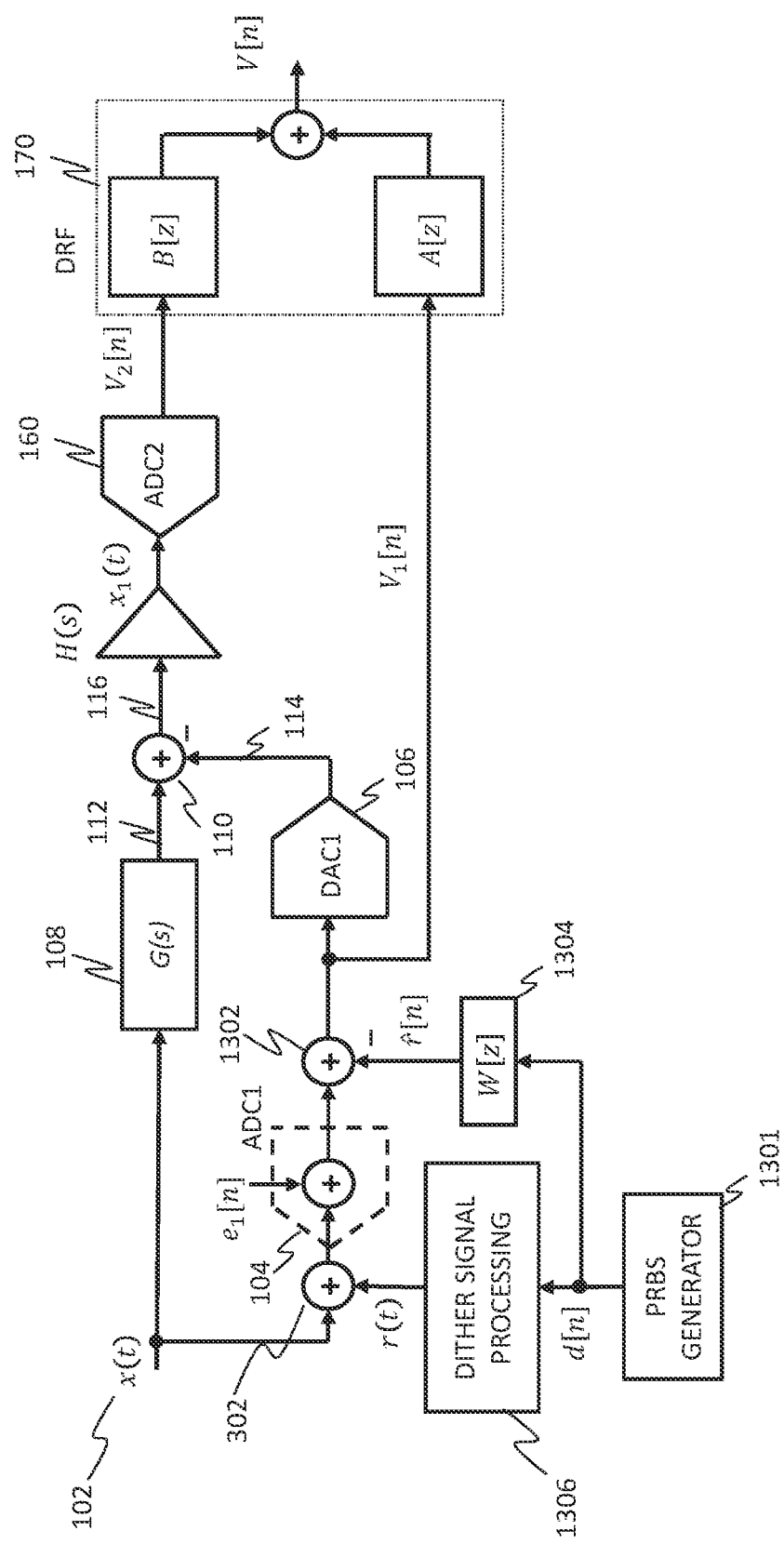
FIG. 13 provides a schematic illustration of a CT residue generation system that subtracts the dither signal d[n] that is spectrally-shaped by means of a digital lifter W[z] from the output of the quantizer, according to some embodiments of the present disclosure.

FIG. 1B illustrates further details of the CT residue generation system 100A illustrated in FIG. 1A (where elements with the same reference numerals are intended to illustrate the same or functionally analogous elements as those shown in FIG. 1A). As is shown in FIG. 1B, the CT residue generation system 100 may generate a CT filtered residue signal $x_1(t)$ by amplifying and filtering by a band-selective residue filter H(s) the difference of a time-delayed input signal x(t) and a reconstructed approximation/version of the input signal, as converted by a quantizer 104 (ADC1) and injected by the DAC 106 (DAC1). The processed/filtered residue signal $x_1(t)$ may then be quantized by a backend ADC 160, shown in FIG. 1B as "ADC2," to generate a digital output $V_2[n]$, as illustrated in FIG. 13.

In various embodiments, the backend ADC 160 may be a CT pipeline ADC that may include further CT residue generation systems/stages, or any other type of ADC satisfying speed and performance requirements for the target application. In some cases, the backend ADC 160 includes a voltage-controlled-oscillator based ADC. Further, the output sequence of the CT residue generation system 100 can be computed from a combination of $V_2[n]$ and an output $V_1[n]$ of the quantizer 104, e.g., using an appropriate digital filter typically referred to as a "digital reconstruction filter" shown as DRF 170 in FIG. 1B.

The final output V[n] of the CT residue generation system 100 may be attained by combining (e.g., adding) the digital output $V_1[n]$, produced by ADC1 and filtered by a discrete-time filter A[z], and $V_2[n]$, filtered by a filter B[z]. Together, A[z], B[z], and the combiner/summer may be seen as forming a digital reconstruction filter (DRF 170). The cascaded system of DAC1, AMP1, ADC2, and any other components in the cascade, having a discrete-time input $V_1[n]$ and a discrete-time output $V_2[n]$ may be modeled as a time-invariant system with an input-to-output relationship defined by the DT transfer function $$H[z] = \frac{V_2[z]}{V_1[z]}.$$

The H[z] transfer function may be derived by an appropriate discretization of the CT impulse or frequency responses of the cascaded systems, such as, but not limited to, the system response of DAC1, the system response of AMP1 as characterized by H(s), and the system response of ADC2 as characterized by its signal transfer function.

FIG. 1B further illustrates a quantization error $e_1[n]$ introduced into the $V_1[n]$ digital data by the quantization operation performed by ADC1. Ideally, the quantization error $e_1[n]$ should be eliminated or cancelled from the output V[n] if the filter coefficients in DRF 170 are chosen such that they satisfy the equation A[z]+B[z]·H[z]=0. However, in practice, $e_1[n]$ is oftentimes not fully cancelled from V[n], since the coefficients of A[z] and B[z] do not always precisely or accurately satisfy the equation A[z]+B[z]·H[z]= 0 due to errors in the measurement of H[z] and/or finite coefficient resolution of the DRF filters. Furthermore, the $e_1[n]$ quantization error signal is a deterministic function of the input, and for small signals or many simple signals (e.g. sinusoidal) will result in input-dependent distortion, appearing as signal-dependent distortion in the ADC1 output spectrum $V_1[n]$. The combined effect of both non-idealities results in undesirable signal distortion appearing in the spectrum of the reconstructed output V[n]. FIG. 2 provides four equations associated with the descriptions of FIG. 1B.

As the foregoing illustrates, improvements with respect to addressing the quantization error $e_1[n]$ of the quantizer ADC1 and reduce power of the residue signal would be desirable.

Using Additive Dither to Linearize the Quantizer

Embodiments of the disclosure propose systems and methods for addressing the quantization error $e_1[n]$ of the quantizer ADC1 of a CT residue generation system based on the use of a small random noise signal (i.e., dither). In particular, embodiments of the disclosure are based on the insight that application of an appropriate dither signal, r(t), to the input of the quantizer can reduce the correlation between the quantization error $e_1[n]$ and the digitized output $V_1[n]$, thereby reducing the input-dependent distortion and whitening the spectrum of a CT residue generation system. "Whitening the spectrum" refers to introducing randomization to spreading the spurs into the noise floor of the spectrum or turns the spurs into white noise. The effect of whitening the spectrum help to reduce or eliminate the input signal-dependent distortion from the spectrum.

Figure 3:
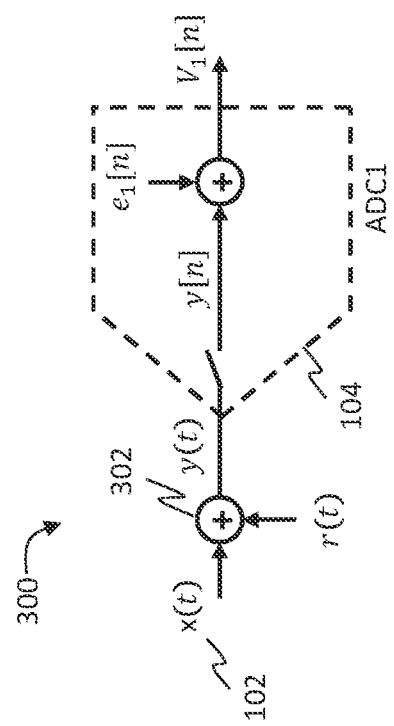
FIG. 3 illustrates a quantizer ADC1 of a CT residue generation system sampling an input that includes an input signal x(t) and a dither signal r(t), according to some embodiments of the disclosure.

FIG. 3 illustrates the analog-to-digital conversion performed by ADC1 104, which may be decomposed into a sampling operation of the analog input waveform y(t) (illustrated as a switch) to create a discrete-time sequence y[n], followed by an amplitude quantization of the sampled values (illustrated as a process where quantization error $e_1[n]$ is added), resulting in the digital output value $V_1[n]$ being represented by a digital word of a prescribed length.

Figure 4:
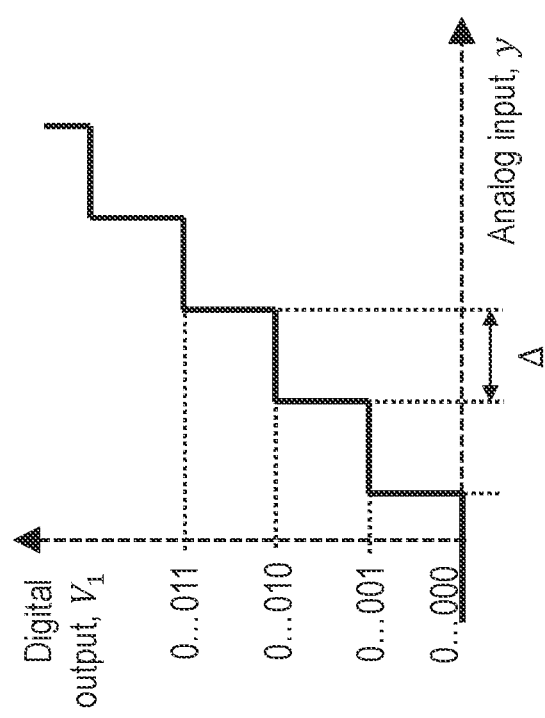
FIG. 4 illustrates output values as function of the input values for the quantizer depicted in FIG. 3, according to some embodiments of the disclosure.

The transfer characteristic of the quantizer, which may be a type of uniform quantizer with a quantization step size of Δ, is shown in FIG. 4. The dither signal r(t) may be added to an analog input signal x(t) at node 302 in FIG. 3 prior to the sampling operation to yield analog input signal y(t). Node 302 is at the input of ADC1 104 or within ADC1 104, and is not in the forward path having CT filter 108. Node 302 can be single-ended or differential. Node 302 can implement current-mode summation, or voltage-mode summation. As a result, the discrete-time sequence y[n.] generated from the sampling operation is y[n]=x[n]+r[n]. Since the quantization operation acts on sampled values, to render the quantization noise in the $V_1[n]$ signal spectrally white, the applied dither signal r(t) may be such that the sampled sequence of the applied dither signal sequence r[n] has an approximately uniform probability distribution with a peak-to-peak amplitude spanning one quantizer step Δ and zero mean, as illustrated in FIG. 6C. In other words, applied dither signal sequence r[n] has a uniform (rectangular) probability density function over a range of $$-\frac{\Delta}{2} \text{ to } +\frac{\Delta}{2}.$$

The quantizer step size Δ can be referred to as a least significant bit or LSB of quantizer defining a change of input required to change the LSB of the quantizer's digital output code.

Although whitening the output spectrum, the additive dither signal r(t) may result in a higher total error power, causing an increase in the power of the filtered residue signal $x_1(t)$ subsequent to amplification by the residue filter H(s). The increased signal swing at the input of ADC2 160 may reduce the error correction range needed for robust ADC operation in the presence of other sources of error in the CT residue generation system, such signal images created by DAC1, offsets, and mismatches between circuit components of the system. The increased power of the filtered residue signal $x_1(t)$ may cause the signal to exceed the maximum input level of ADC2 160, causing degraded linearity and noise performance of the pipeline ADC.

Using High-Pass Shaped Additive Dither to Linearize the Quantizer

Embodiments of the disclosure are further based on the insight that the applied non-subtractive signal power of the dither signal r(t) can be spectrally-shaped away from the pass-band frequencies of H(s), such that the increase in the power of the filtered residue signal $x_1(t)$ is reduced or minimized. Since in some embodiments the transfer function H(s) may implement a low-pass frequency response, the dither signal r(t) may be shaped to reduce or minimize its spectral power in the low-frequency range by means of a high-pass filter (HPF) L(s) that may act on the signal d(t), as is illustrated in FIG. 5.

Figure 5:
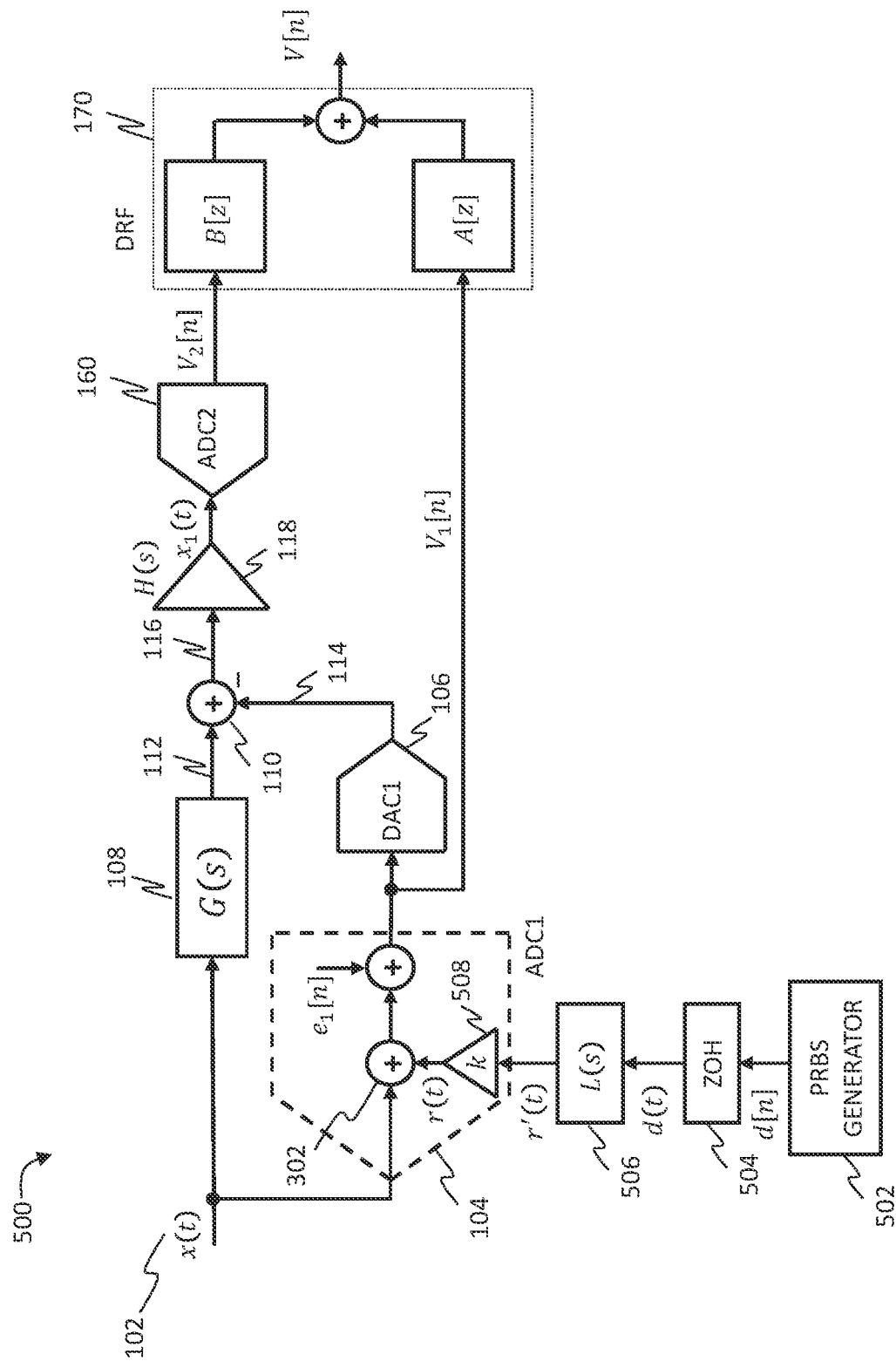
FIG. 5 provides a schematic illustration of a CT residue generation system to use a dither signal r(t) that is spectrally-shaped by means of a high-pass filter L(s), according to some embodiments of the disclosure.

Specifically, FIG. 5 extends the embodiments illustrated in FIGS. 1B and 3 and adds dither generation circuitry to generate a high-pass shaped dither r(t). The circuitry to generate the high-pass shaped dither r'(t) can include PRBS generator 502, digital-to-analog converter 504, and an analog filter 506.

Similar to FIG. 3, a node 302 is provided within ADC1 104 or at the input of ADC1 104 to inject the high-pass shaped dither r(t) into ADC1 104. Specifically, the high-pass shaped dither r(t) can be injected though a summation of the input signal x(t) with the high-pass shaped dither signal r'(t) at node 302. In some cases, the summation at node 302 is a weighted summation of the input signal x(t) with the high-pass shaped dither signal r'(t), where r'(t) is scaled by the weighting factor k (functionality of scaling is illustrated as scaler 508) to achieve the desired dither amplitude.

Figure 12:
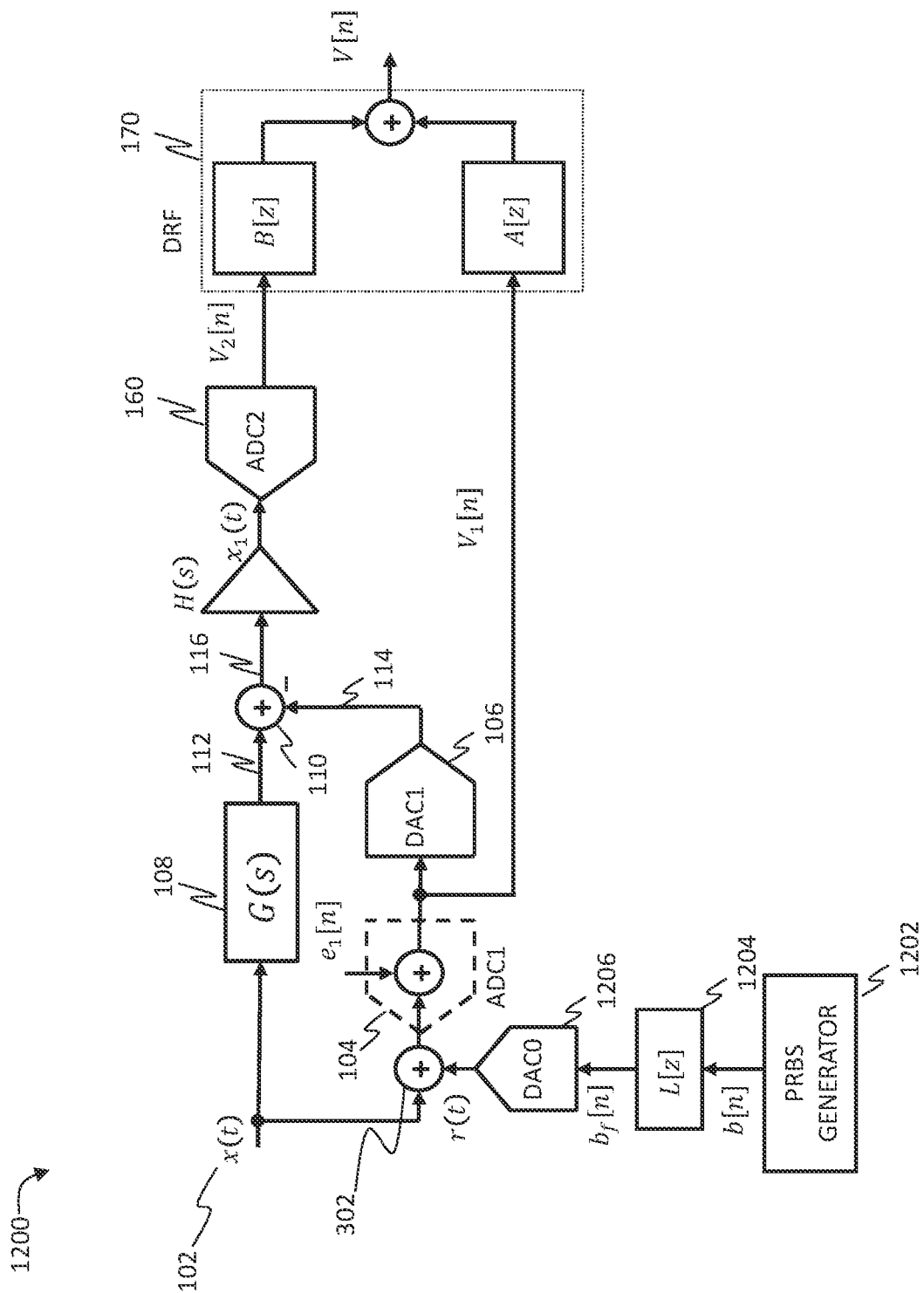
FIG. 12 provides a schematic illustration of a CT residue generation system that utilizes a dither signal r(t) that is spectrally-shaped by means of a digital filter L[z] and a digital-to-analog converter (DAC) DAC0, according to some embodiments of the disclosure.

FIG. 5, as well as FIGS. 12 and 13, illustrates some of the same elements as those shown in FIGS. 1A-1B and 3 (e.g., the input signal x(t), the quantizer 104, the feedforward DAC 106, the CT filter 108, etc.) to illustrate the same, similar, or functionally analogous elements. Descriptions of these elements provided with respect to FIGS. 1A-1B and 3 are applicable to FIGS. 5, and 12-13, so that, in the interests of brevity, these descriptions are not repeated and only the differences are described.

PRBS generator 502 can generate a 1-bit discrete-time PRBS d[n] having a substantially flat shaped spectrum (i.e., a spectrum in which the magnitudes of all frequency components are substantially equal), as illustrated in FIG. 6B. PRBS generator 502 can be implemented as a white noise generator. Per the properties of a PRBS sequence, the value of d[n] may have an approximately equal probability of being in one of the two states, characterized by a binomial probability distribution illustrated in FIG. 6A. In some embodiments, the PRBS generator 502 can be implemented as a linear feedback shift register. In some embodiments, the PRBS generator 502 can be implemented as a linear hybrid cellular automata.

The CT dither signal d(t) may be created by converting d[n] by digital-to-analog converter 504, such as a zero-order-hold (ZOH) circuit. Consequently, d(t) will also take on one of two analog values.

An analog filter 506 with a filter response L(s), HPF circuitry, can shape the CT dither signal d(t) to generate the shaped dither signal r'(t). In some embodiments where the filter H(s) 118 has a low-pass filter response, the analog filter 506 can implement a high-pass filter response complementary to the filter H(s) 118 to shape the dither signal d(t) away from the filter H(s) 118. Broadly speaking, the analog filter 506 implements a filter response L(s) that is complementary response to the filter H(s) 118 to shape the dither signal d(t) away from the filter H(s) 118. In this manner, filter H(s) 118 can filter out the dither signal d(t) so that the dither signal d(t) does not appear in the residue $x_r(t)$ 116.

Optionally, as is also shown in FIG. 5, the output of the analog filter 506 (e.g., an analog HPF), r'(t), may be scaled by scaler 508 having a weighting factor k, such that r(t) satisfies the desired amplitude property illustrated in FIG. 6C. The scaler 508 having a weighting factor k can scale r'(t) to generate high-pass shaped dither signal r(t) with the desired amplitude. In some cases, the weighting or scaling functionality can be implemented as part of the summation at node 302. In some cases, the weighting or scaling functionality of scaler 508 can be implemented within digital-to-analog converter 504 or analog filter 506.

As discussed in relation to FIG. 3 ADC1 101 can sample the input signal x(t) and the high-pass shaped dither signal r(t). The spectrum of samples r[n] is illustrated in FIG. 6D, where it can be seen that the low-frequency power of r[n] has been attenuated by the analog filter 506.

Generating the High-Pass Shaped Additive Dither

Figure 7:
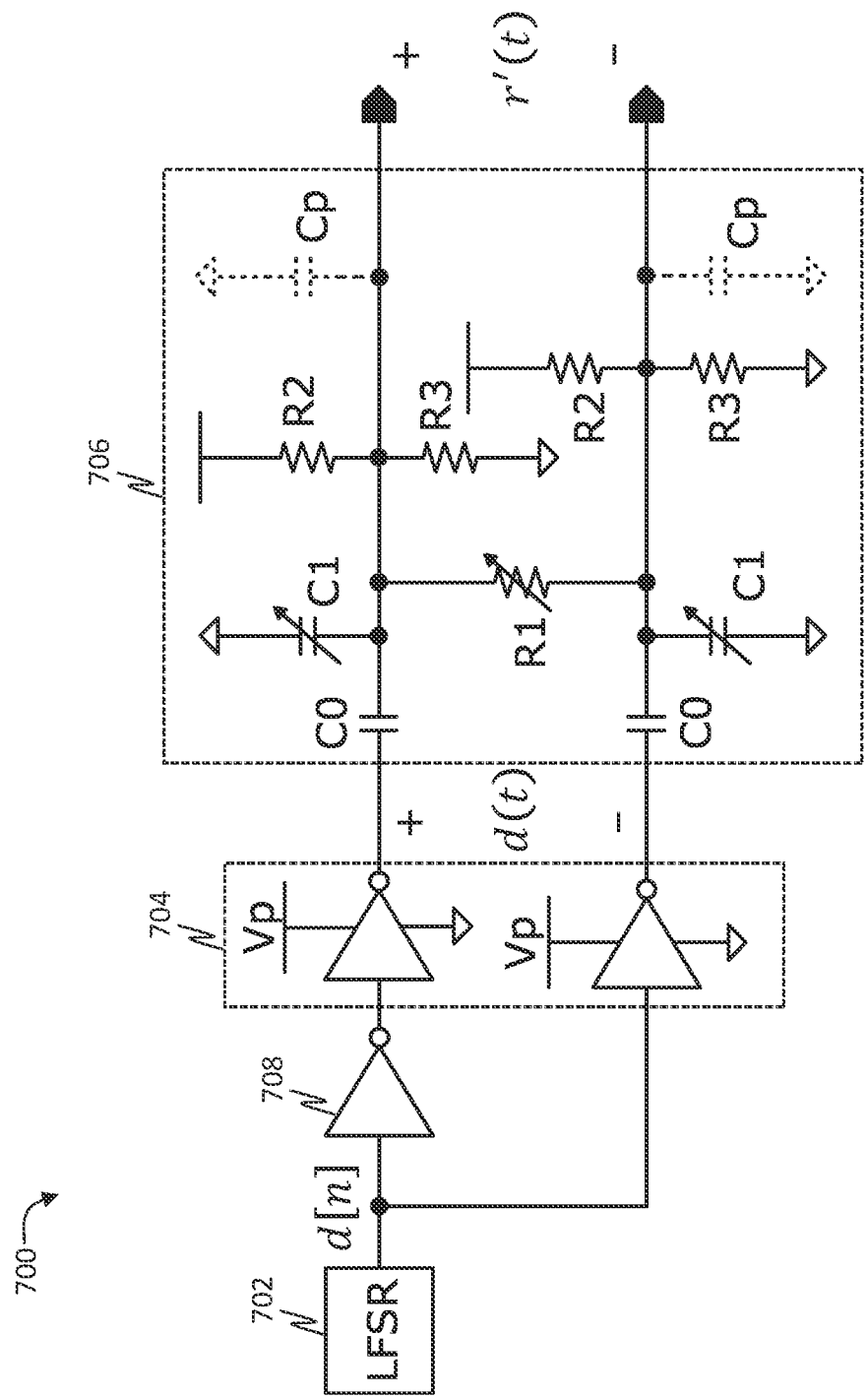
FIG. 7 provides an electric circuit diagram of an example dither generation circuit to generate a high-pass shaped dither signal r(t), according to some embodiments of the disclosure.

FIG. 7 provides an electric circuit diagram of an example dither generation circuit 700 to generate a high-pass shaped dither signal r'(t), according to some embodiments of the disclosure. The dither signal r' (t) may be generated by using the dither generation circuit 700 to perform a high-pass filtering of the signal d(t) to achieve the desired properties. The dither generation circuit 700 can realize a high-pass shaped dither signal r(t) to be added at node 302, e.g., at the input to the quantizer ADC1 as described herein.

To that end, as is illustrated in FIG. 7, the dither generation circuit 700 may include a 1-bit PRBS generator 702 to generate the dither sequence d[n], which may be implemented as linear feedback shift register (LFSR) of order N with N storage elements in some embodiments.

The dither generation circuit 700 may further include a pair of inverters 704 for generating a differential continuous-time signal d(t). One of the inverters 704 (e.g., the bottom one of the inverters 704 shown in FIG. 7) may be driven by d[n] and the other one (e.g., the top one of the inverters 704 shown in FIG. 7) may be driven by a complement of d[n] (because of the additional inverter 708, as illustrated in FIG. 7).

In addition, the dither generation circuit 700 may include a differential analog first-order high-pass filter 706 that may, in some embodiments, be formed by capacitors C0, tunable capacitors C1, tunable resistor R1, and bias resistors R2 and R3 as illustrated in FIG. 7.

As is indicated in FIG. 7, the filter components C1 and R1 may be tunable. When the dither generation circuit 700 is used, the peak-to-peak amplitude of the generated dither signal r'(t) may be proportional to $$\frac{C0}{C1 + C0 + Cp} V_p,$$

where $V_p$ is a positive supply voltage. Tuning of the C1 capacitance value and/or of the $V_p$ voltage may be used to correct the dither amplitude in the presence of an undesirable parasitic capacitance Cp between the output terminals and ground. In some embodiments, the pole frequency $\omega_p$ of the high-pass filter for providing a high-pass shaped dither signal may be proportional to $$(C0 + C1 + Cp)\left(\frac{R1}{2}\right).$$

Tuning the resistance value of R1 may be used to set the pole's frequency, which affects the probability distribution of the sampled dither r[n]. The first-order filter applied to d(t) may be to have the pole frequency $\omega_p$ of its characteristic transfer function $$L(s) = \frac{s}{s + \omega_p}$$

be proportional to the sample rate $f_{ck}$ of ADC1 according to $$\omega_p = \frac{2\pi f_{ck}}{9.0635}.$$

Figure 8:
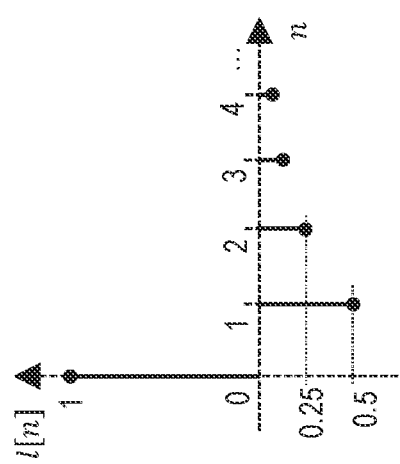
FIG. 8 illustrates an infinite impulse response l[n], according to some embodiments of the disclosure.

If this condition is satisfied, then the impulse response of the transfer function relating d[n] and r[n], $$\frac{r[z]}{d[z]} = L[z] = \frac{z-1}{z-0.5}$$

may be described by $$l[n] = \delta[n] - \sum_{k=1}^{\infty} 2^{-k}\delta[n-k],$$

where δ[n] is the discrete-time delta function. The infinite impulse response l[n] according to some embodiments of the disclosure is illustrated in FIG. 8, It can be demonstrated that convolving the l[n] impulse response with a sufficiently long 1-bit PRBS sequence having the previously outlined properties of d[n] can produce a sequence having a substantially uniform (e.g., rectangular) probability density function (PDF).

The dither generation circuit 700 may be particularly advantageous in that it requires only a single pseudorandom number (PRN) sequence with no multi-bit digital filter circuit, does not require multi-phase clock generation typical of a switch-capacitor filter implementation, and may use resistor/capacitor tuning to achieve the desired transfer function. However, in other embodiments, circuits other than the dither generation circuit 700 may be used to realize a high-pass shaped dither signal r(t) to be added at node 302, e.g., at the input to the quantizer ADC1 as described herein.

Injecting or Adding the High-Pass Shaped Additive Dither to the Input of Quantizer ADC1

The quantizer ADC1 104 can include a plurality of comparators. Each comparator may be coupled to a unique voltage reference value $v_{th}^n$, and the difference between two successive values may be the multi-level quantizer's step size: $v_{th}^{n+1} - v_{th}^n = \Delta$.

Figure 9:
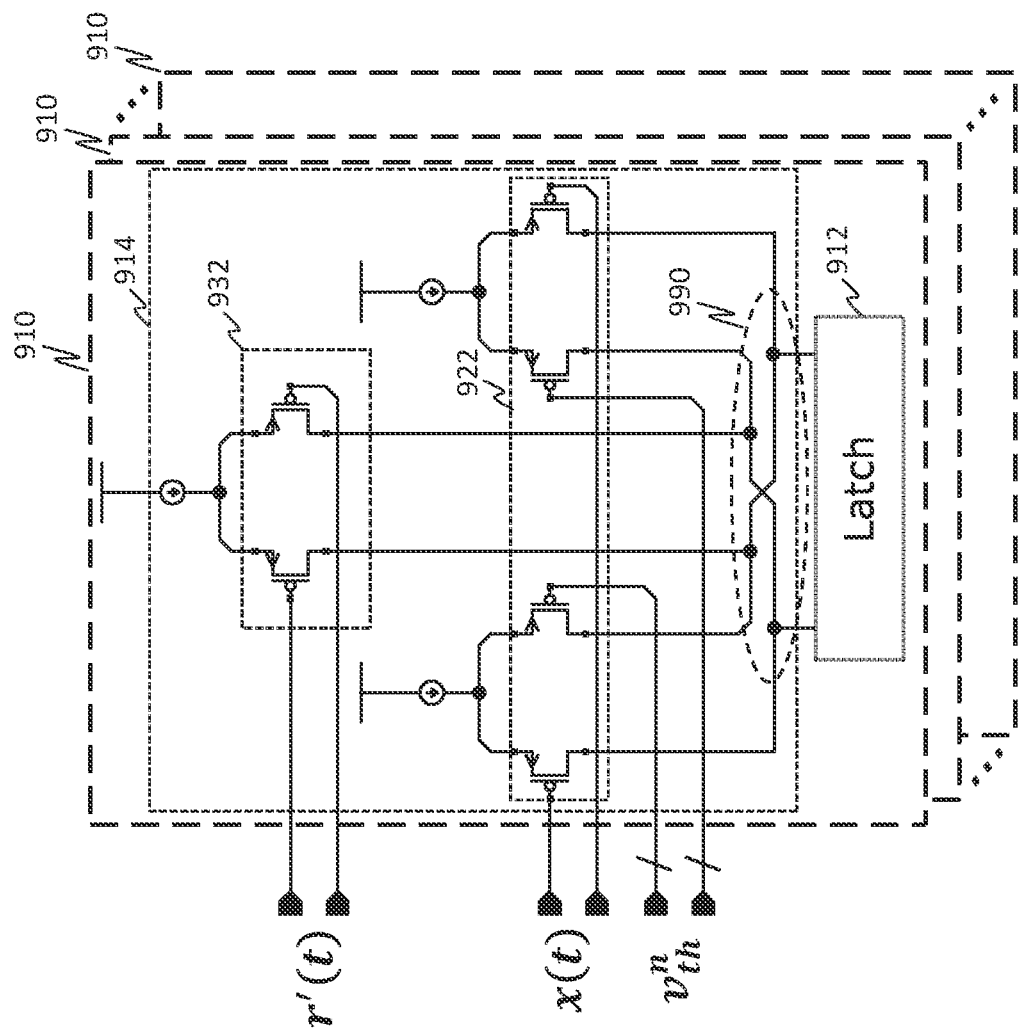
FIG. 9 provides a schematic illustration of a plurality of comparators that may be to add the high-pass shaped dither signal r(t) to the input x(t) to the quantizer ADC1, according to some embodiments of the disclosure.

In some embodiments, the high-pass shaped dither signal r'(t) may be added to the input x(t) to the quantizer ADC1 104 by a weighted current-mode summation circuit (whose function is illustrated as node 302) that may be included inside each comparator's pre-amplifier of a multi-level flash converter implementing ADC1 104, as is illustrated in FIG. 9. The current-mode summation circuit is to effectively sum the analog input signal x(t) and the high-passed dither signal r'(t) at a circuit node in the comparator.

Comparators of ADC1 104 compare two input signals and output a comparator result (e.g., a logic high or a logic low to indicate whether one input signal is higher or lower than the other input signal). For ADC1 104, comparators 910 compare an analog input signal x(t) to ADC1 104 and respective voltage reference value $v_{th}^n$. Comparators 910 can be implemented based on a variety of circuit architectures. In some embodiments, a pre-amplifier of a comparator amplifies a difference between the two input signals, and a latch provides a fast comparator result based on the amplified difference. As illustrated in FIG. 9, comparators 910 of ADC1 104 may each include a latch 912 and a pre-amplifier circuit 914.

Latch 912 is shown as an example of a regeneration circuit or regenerative core operating, e.g., with positive feedback to quickly output a comparator result based on the difference between the comparator's inputs. An exemplary latch 912 can include a dynamic latch, which can be implemented using cross-coupled inverters for regeneration.

The pre-amplifier circuit 914 may be to generate a difference of the input voltage signal x(t) and the reference voltage $v_{th}^n$, which defines the comparator's threshold value. The difference in the form of current appears at the input of the latch 912, which latches the difference to output a comparison result.

The pre-amplifier circuit 914 may include two differential pairs of input transistors 922 receiving x(t) and $v_{th}^n$ to generate the difference at the input of latch 912 (a common node 990). Generating a difference can be viewed as performing subtraction of the two inputs at the common node 990. Accordingly, the common node 990 can be used for adding the dither signal r'(t) to the input signal x(t), since order of operations do not matter for subtraction and addition. As illustrated, the pre-amplifier circuit 914 further includes a differential pair of dither transistors 932 that receives the dither signal r'(t) to generate (or steer) a further current that can be summed at the input of latch 912 (the common node 990). As a result, the pre-amplifier circuit 914 can effectively add the dither signal r'(t) to the input signal x(t) at the common node 990.

The dither amplitude may be scaled to span one LSB (Δ) by the combined effect of tuning the HPF circuitry gain by means of C1 (shown previously in FIG. 7) and designing the ratio of the transconductance of the differential pair of dither transistors 932 to the transconductance of the differential pair of input transistors 922, to achieve the desired weighting factor k in the current-mode summation (as illustrated in FIG. 5).

In some embodiments, the supply voltage Vp of the HPF driving inverter elements (as seen in FIG. 7 for example) or the transconductance of the differential pair of dither transistors 932 may be tuned to implement gain control to realize high-pass shaped dither signal r(t) with the desired amplitude as described herein.

Figure 10:
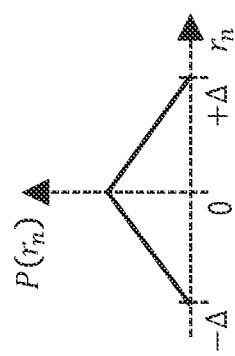
FIG. 10 provides a schematic illustration of a triangular-shaped probability density function of a dither signal r[n], according to some embodiments of the disclosure.

Generating and Using a High-Pass Shaped Additive Dither Having a Triangular-Shaped PDF In some embodiments, an alternative type of shaped dither signal capable of reducing or eliminating signal-dependent distortion may have a triangular-shaped PDF, with its amplitude spanning from −Δ to +Δ (i.e., two LSBs) and having zero mean, e.g., as illustrated in FIG. 10.

In some embodiments, using a higher additive dither amplitude may further increase the power of the amplified residue signal $x_1(t)$, which may result in a greater probability of the residue signal $x_1(t)$ amplitude exceeding the input range of ADC2 106, while further reducing the available error correction range of the pipeline ADC to other sources of error. In order to bound $x_1(t)$ to within the allowable ADC2 input range, the gain of the residue lifter H(s) may be lowered, at the cost of reduced overall noise and linearity performance of the pipeline ADC. The triangular-PDF dither sequence may be spectrally-shaped to reduce its spectral power in the pass-band frequencies of H(s) filter, using the hereto outlined procedure, thereby mitigating the effect of increased dither amplitude on the power of $x_1(t)$.

Figure 11:
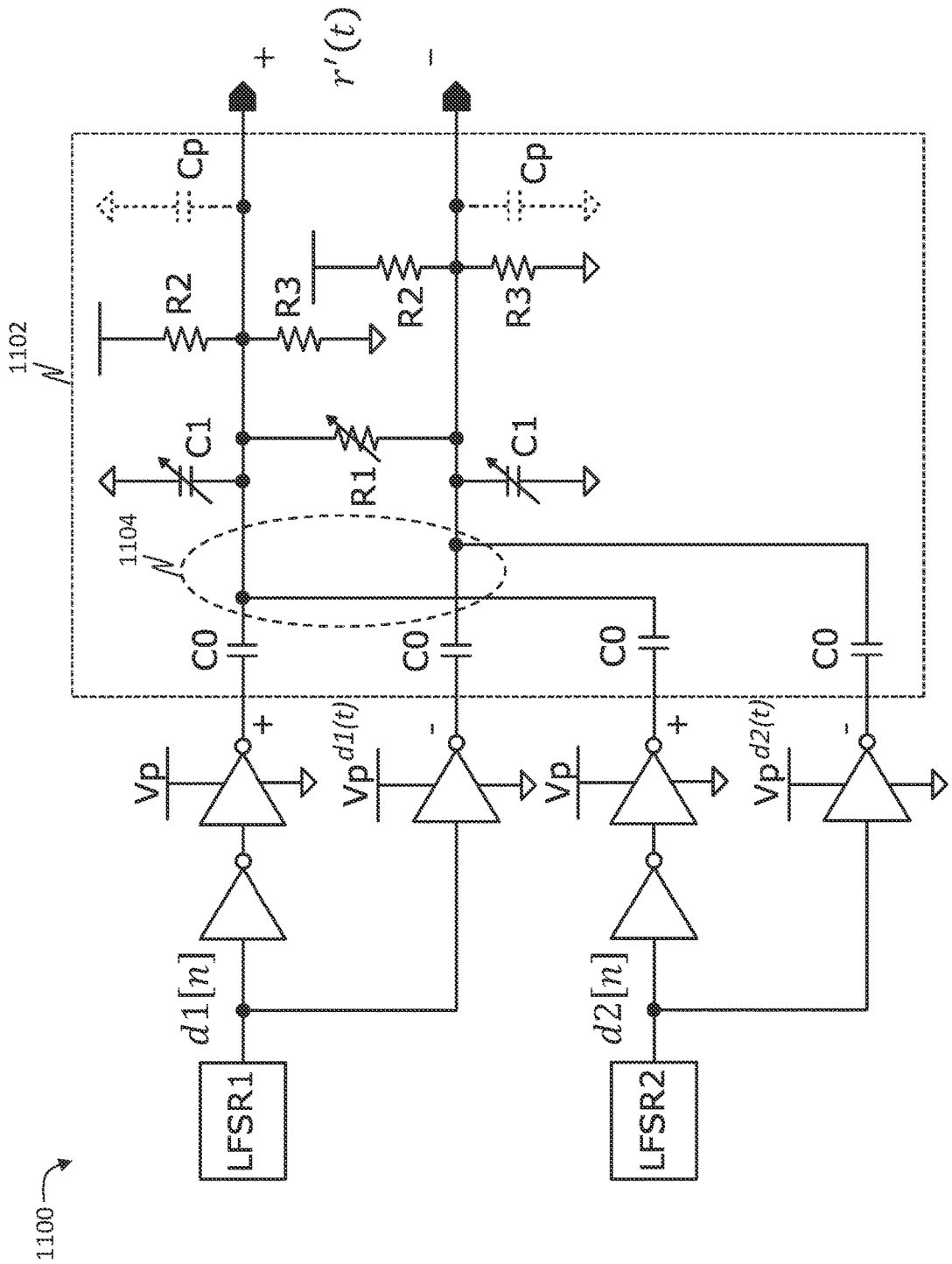
FIG. 11 provides an electric circuit diagram of an example dither generation circuit to generate a high-pass shaped dither signal r(t) with a triangular-shaped probability density function, according to some embodiments of the disclosure.

FIG. 11 provides an electric circuit diagram of an example dither generation circuit 1100 to generate a high-pass shaped dither signal r(t) with a triangular-shaped probability density function, according to some embodiments of the disclosure. Triangular-PDF dither, whose PDF is illustrated in FIG. 10, can be created by the summation of two uncorrelated uniformly-distributed sequences d1[n] and d2[n], having the desired spectral shape (e.g., a rectangular-shaped PDF), since the summation of two independently-random processes convolves their PDFs. The summation may be performed either prior or after the HPF circuitry 1112.

In some embodiments, two independent, 1-bit PRBS sequences d1[n] and d2[n], each characterized by a binomial probability distribution as, for example, illustrated in FIG. 6A, may be applied as two separate inputs to the HPF circuitry 1112. Each sequence may have a substantially flat spectral shape, as illustrated in FIG. 6B. The sequences may be created by a single LFSR circuit generating a 2-bit output, or by two independent LFSR circuits generating PRBS patterns that are uncorrelated with each other. The sequences are converted to respective differential dither signals d1(t) and d2(t) using inverters operating with supply voltage Vp. The differential dither signals d1(t) and d2(t) are summed or added at node 1104. Node 1104 can be single-ended or differential. Node 1104 can implement current-mode summation or voltage-mode summation.

By superposition analysis of the linear circuit, i.e., filter 1102, the output r and its sampled values r[n] can be represented as an equally-weighted sum of two waveforms: (1) the output produced by applying d1[n] with d2[n.] not being applied, and (2) the output waveform produced by applying d2[n] with d1[n] not being applied. Consequently, the composite waveform generated by the simultaneous application of both d1[n] and d2[n] inputs yields a dither having a triangular-PDF and an approximately doubled peak-to-peak amplitude.

The dither generation circuit 1100 is otherwise similar to the dither generation circuit 700, described above, e.g., in terms of the tunable components C1, R1, and the descriptions of the dither generation circuit 700 are not repeated for the dither generation circuit 1100.

Generating and Using a Multi-Level High-Pass Shaped Additive Dither

In an alternative embodiment, a multi-level spectrally flat PRBS sequence b[n] can be high-pass filtered by a digital filter L[z] 1204 and injected at the input of ADC1 by an N-level DAC0 1206, as illustrated in a CT residue generation system 1200 illustrated in FIG. 12. In some implementations, the digital filter L[z] 1204 generates $b_f[n]$, which is a multi-bit spectrally-shaped dither sequence (e.g., a 2-bit dither sequence, 3-bit dither sequence, etc.), and the PDF of its discrete-level values should approximate the continuously-distributed uniform or triangular-PDF of the desired dither signal. The circuitry to generate the spectrally-shaped dither signal r(t) includes a PRBS generator 1202, a digital filter 1204 having transfer function L[z], and a mufti-bit DAC 1206 (shown as DAC0).

In some embodiments, the generated spectrally-shaped dither signal r(t) may be added to the input signal in a dedicated summer circuit (illustrated as node 302) prior to ADC1 104. In some embodiments, the dither signal r(t) may be added to the input signal x(t) in ADC1 as described for the previous embodiments (e.g., as seen in FIG. 9). Although not explicitly shown, a weighting or scaling function can be implemented at node 302 to enable an amplitude-adjusted dither signal r'(t) to be added to the input of ADC1 104. In some cases, the weighting or scaling can be implemented in the digital filter 1204. In some cases, the weighting or scaling can be implemented in DAC0 1206.

The PRBS generator 1202 is a multi-bit pseudorandom sequence generator, and generates a multi-bit dither sequence b[n]. A digital filter 1204 having a transfer function L[z] is applied to b[n] to spectrally shape the dither sequence. The spectrally-shaped multi-bit dither sequence $b_f[n]$ is converted by DAC0 1206 into an analog dither signal r(t) having the desired spectral shape.

In some embodiments, the PRBS generator 1202 is a single-bit pseudorandom sequence generator, and generates a single-bit dither sequence b[n]. The digital filter 1204 having the transfer function L[z] is applied to b[n] to spectrally shape the dither sequence and create a multi-level spectrally-shaped dither sequence $b_f[n]$. Phrased differently, the digital filter 1204 can generate more levels (e.g., a multi-level spectrally-shaped dither sequence) than the number of levels of b[n] (e.g., a single-bit dither sequence) at the input of the digital filter 1204. Digital filter 1204 can be implemented as a finite impulse response filter or an infinite impulse response filter, where filter coefficients have multi-bit resolution. The generated multi-level spectrally-shaped dither sequence $b_f[n]$ can have the desired spectral shape, i.e., can approximate the desired probability density function. The multi-level spectrally-shaped dither sequence $b_f[n]$ can be provided as input to the multi-bit DAC 1206 to generate the spectrally-shaped dither signal r(t). The dither signal r(t) can be injected at node 302 as discussed herein.

Otherwise the CT residue generation system 1200 is similar to the CT residue generation system 500, described above, and the descriptions of the CT residue generation system 500 are not repeated for the CT residue generation system 1200.

Generating and Using a Subtractive Dither

A subtractively dithered quantizing system illustrated in FIG. 13. Benefits of removing the injected dither in the feedforward path can reduce power of the filtered residue signal $x_1(t)$ and therefore lessen the injected dither's impact on available error correction range. The dither circuitry includes PRBS generator 1301, dither signal processing part 1306, and digital filter 1304 having transfer function W[z]. The dither signal d[n] is filtered by a digital filter W[z] 1304 and the filtered dither signal r̂[n] is subsequently subtracted after quantization at the output of ADC1 104. Subtraction of the filtered dither signal r̂[n] is illustrated as circuitry 1302.

In such an embodiment, the signal processing for generating and applying the dither signal r(t) to the input of the quantizer ADC1 104, i.e., dither signal processing part 1306, may be accomplished by an analog filter 506 and ZOH 504 as illustrated in FIG. 5, or by a digital filter 1204 and digital-to-analog converter DAC0 1206 as illustrated in FIG. 12.

The additional digital filter W[z] 1304 may be applied to d[n] prior to subtraction to spectrally shape the digital dither signal r̂[n] in an equivalent manner to the spectral shaping performed on r(t) by the dither signal processing part 1306, and correct for the effect of the dither injecting circuit, such that the residual dither power in the $V_1[n]$ signal is minimized.

Subtraction by circuitry 1302 can be implemented in different ways. In some embodiments, the subtraction is performed using a digital subtractor subtracting the filtered digital dither signal r̂[n] from the output from the quantizer ADC1 104. In some embodiments, the filtered digital dither signal r̂[n] with flipped polarity is concatenated with the output from the quantizer ADC1 104 to implement subtraction. In some embodiments, the removal or subtraction of the filtered digital dither signal r̂[n] from the feedforward path may be performed using DAC1 106, To implement the removal or subtraction of the filtered digital dither signal r̂[n], the DAC1 106 can further include one or more DAC elements of smaller weights than the most significant bit (MSB) section elements, that are controllable by filtered digital dither signal r̂[n]. DAC1 106 may be segmented into a MSB section of unary-weighted elements which are controlled by the thermometrically-coded outputs of ADC1 104 and a least significant bit (LSB) section of binary- or unary-weighted elements controlled by the filtered dither signal r̂[n]. For instance, each unary-weighted DAC element in the MSB section is controllable by a corresponding output of a comparator in ADC1 104, to generate an analog output signal based on the output code from ADC1 104. Likewise, each binary- or unary-weighted elements of the LSB section is controllable by a corresponding bit of the filtered dither signal r̂[n] from the digital filter W[z] 1304. Accordingly, the DAC element(s) in the LSB section can be controlled to remove an amount of signal in the DAC1 106 that corresponds to the filtered digital dither signal r̂[n]. For instance, the filtered digital dither signal r̂[n] having its polarity flipped can control one or more DAC element(s) in the LSB section to subtract the filtered digital dither signal r̂[n] effectively from the input of DAC1 106. As a result, the injected dither is removed from the feedforward path.

Selected Examples

Example 1 is a continuous-time residue generation stage, comprising: a dither sequence generator to output a digital dither sequence; a dither signal processing part to receive the digital dither sequence (e.g., d[n]) and output a spectrally-shaped analog dither signal (e.g., r(t)); a forward path having a continuous-time filter to receive an analog input signal (e.g., 108); a feedforward path having a quantizer (e.g., 104) to receive the analog input signal and a digital-to-analog converter (e.g., 106) to receive a digital output of the quantizer, the quantizer having a node (e.g., 302) to sum the spectrally-shaped analog dither signal and the analog input signal; and a filter (e.g., 118) to receive a residue signal, the residue signal based on an output signal of the forward path and an output signal of the feedforward path.

In Example 2, Example 1 can optionally include the spectrally-shaped analog dither signal having an amplitude of one quantizer step of the quantizer, and a substantially uniform probability density function. See e.g., FIG. 6C.

In Example 3, Example 1 or 2 can optionally include the spectrally-shaped analog dither signal having an amplitude of two quantizer steps of the quantizer, and a substantially triangular probability density function. See e.g., FIG. 10.

In Example 4, any one of Examples 1-3 can optionally include the spectrally-shaped analog dither signal being a high-pass shaped dither signal, and the filter having a low-pass filter response.

In Example 5, any one of Examples 1-4 can optionally include: the dither sequence generator being a 1-bit pseudorandom binary sequence generator. See e.g. FIG. 7.

In Example 6, any one of Examples 1-5 can optionally include: the dither sequence generator comprising a linear feedback shift register with storage elements. See e.g., FIG. 7.

In Example 7, any one of Examples 1-4 can optionally include: the dither sequence generator comprises multi-bit pseudorandom sequence generator. See e.g., FIG. 12.

In Example 8, any one of Examples 1-4 can optionally include the dither sequence generator comprising two 1-bit pseudorandom binary sequence generators outputting two 1-bit pseudorandom binary sequences respectively, and the dither signal processing part comprising a node to sum two analog dither signals converted from the two 1-bit pseudorandom binary sequences to form the spectrally-shaped analog dither signal. See e.g., FIG. 11.

In Example 9, any one of Examples 1-4 can optionally include the dither sequence generator comprising 2-bit pseudorandom binary sequence generator outputting a 2-bit pseudorandom binary sequence, and the dither signal processing part comprising a node to sum two analog dither signals converted from the respective bits of the 2-bit pseudorandom binary sequence to form the spectrally-shaped analog dither signal.

In Example 10, any one of Examples 1-9 can optionally include the dither signal processing part comprising: a zero-order-hold circuit to receive the digital dither sequence and output an analog dither signal; and an analog filter to receive the analog dither signal and output the spectrally-shaped analog dither signal. See e.g., FIG. 5.

In Example 11, any one of Examples 1-9 can optionally include the dither signal processing part comprising a digital filter to receive the digital dither sequence and output a spectrally-shaped digital dither signal; and a digital-to-analog converter to receive the spectrally-shaped digital dither signal and output the spectrally-shaped analog dither signal. See e.g., FIG. 12.

In Example 12, any one of Examples 1-9 can optionally include a digital filter (e.g., W[z]) to receive the digital dither sequence and output a filtered digital dither signal; and circuitry (e.g., 1302) to subtract the filtered digital dither signal from the digital output of the quantizer. See e.g., FIG. 13.

In Example 13, Example 12 can optionally include the filtered digital dither signal being spectrally-shaped by the digital filter in an equivalent manner as the spectrally-shaped analog dither signal.

In Example 14, any one of Examples 1-13 can optionally include the dither signal processing part comprising: inverters to receive the digital dither sequence and output an analog dither signal; and an analog filter having capacitive and resistive components to receive the analog dither signal and output the spectrally-shaped analog dither signal. See e.g., FIGS. 7, and 11.

In Example 15, any one of Examples 1-14 can optionally include the node being a circuit node (e.g., 990) in a comparator of the quantizer. See e.g., FIG. 9.

In Example 16, any one of Examples 1-15 can optionally include the node being at an input (e.g., 990) of a regeneration core in a comparator of the quantizer. See e.g., FIG. 9.

In Example 17, any one of Examples 1-16 can optionally include the quantizer comprising a comparator, the comparator comprising: a differential pair of dither transistors (e.g., 932) to receive the spectrally-shaped analog dither signal; and differential pairs of input transistors (e.g., 922) each receiving the analog input signal and a comparator threshold; wherein the differential pair of dither transistors and the differential pairs of input transistors are connected at a common node (e.g., 990). See e.g., FIG. 9.

Example 18 is a continuous-time residue generation stage, comprising: a dither sequence generator to generate a digital dither sequence; a dither signal processing part to filter the digital dither sequence and generate a spectrally-shaped analog dither signal; a forward path to delay an analog input signal; a feedforward path having a quantizer and a digital-to-analog converter, the quantizer to sum the spectrally-shaped analog dither signal and the analog input signal, and to quantize the summed spectrally-shaped analog dither signal and the analog input signal; and a filter to filter a residue signal generated from outputs of the forward path and the feedforward path.

In Example 19, Example 18 can optionally include the spectrally-shaped analog dither signal being shaped away from pass-hand frequencies of the filter.

In Example 20, Example 18 or 19 can optionally include the dither signal processing part digitally filtering the digital dither sequence.

In Example 21, Example 18 or 19 can optionally include the dither signal processing part filtering an analog version of the digital dither sequence.

In Example 22, any one of Examples 18-21 can optionally include the dither signal processing part implementing scaling to generate the spectrally-shaped analog dither signal having a predetermined amplitude.

In Example 23, any one of Examples 18-22 can optionally include the dither signal processing part implementing a high-pass filter.

In Example 24, any one of Examples 18-23 can optionally include the dither signal processing part adding two dither signals to generate the spectrally-shaped analog dither signal having a triangular-shaped probability density function.

In Example 25, any one of Examples 18-24 can optionally include the dither signal processing part implementing digital-to-analog conversion.

In Example 26, any one of Examples 18-25 can optionally include the spectrally-shaped analog dither signal having two levels.

In Example 27, any one of Examples 18-25 can optionally include the spectrally-shaped analog dither signal having three or more levels.

In Example 28, any one of Examples 18-27 can optionally include a digital filter to spectrally shape the digital dither sequence in an equivalent manner as the dither signal processing part, and to generate a filtered digital dither sequence; and a node in the feedforward path to subtract the filtered digital dither sequence from a digital output of the quantizer.

In Example 29, any one of Examples 18-28 can optionally include the forward path does not process the spectrally-shaped analog dither signal.

Example 30 is a method to reduce spurs caused by quantization error in a continuous-time residue generation stage, comprising: in a forward path, delaying the analog input signal; in a feedforward path, injecting a spectrally-shaped analog dither signal at an input of a quantizer, quantizing the summed spectrally-shaped analog dither signal and the analog input signal, and generating a reconstructed version of the analog input signal based on the quantizing; generating a residue signal based on the delayed analog input signal and the reconstructed version of the analog input signal; and filtering the residue signal.

In Example 31, Example 30 can optionally include removing a further spectrally-shaped analog dither signal from the feedforward path after the quantizing.

In Example 32, Example 30 or 31 can optionally include filtering a dither sequence to generate the spectrally-shaped analog dither signal.

In Example 33, Example 30 or 31 can optionally include filtering a dither signal converted from a dither sequence to generate the spectrally-shaped analog dither signal.

In Example 34, any one of Examples 30-33 can optionally include adding two dither signals to generate the spectrally-shaped analog dither signal having a triangular-shaped probability density function.

In Example 35, any one of Examples 33-34 can optionally include the spectrally-shaped analog dither signal having an amplitude of one quantization step of the quantizing.

In Example 36, any one of Examples 33-34 can optionally include the spectrally-shaped analog dither signal having an amplitude of two quantization steps of the quantizing.

In Example 37, any one of Examples 33-36 can optionally include the spectrally-shaped analog dither signal being high-pass shaped; and the filtering of the residue signal comprising low-pass filtering.

In Example 38, any one of Examples 33-37 can optionally include the spectrally-shaped analog dither signal being shaped away from pass-band frequencies of the filtering of the residue signal. For instance, any one of Examples 33-37 can optionally include shaping a dither signal away from pass-band frequencies of the filtering of the residue signal to generate the spectrally-shaped analog dither signal.

In Example 39, any one of Examples 33-38 can optionally include scaling a dither sequence or a dither signal to generate the spectrally-shaped analog dither signal having a predetermined amplitude.

In Example 40, any one of Examples 33-39 can optionally include the forward path not delaying or processing the spectrally-shaped analog dither signal.

Example Systems, Devices, Methods, and Variations

As the foregoing illustrates, dither injection at input of ADC1 in CT pipelined ADCs may improve system linearity. As described above, high-pass spectral shaping of injected dither in CT residue generation systems may be used to mitigate the increase in the power of the residue signal, thereby not significantly reducing the available backend correction range. Example analog circuits and methods of generating high-pass shaped dither signal having uniform (rectangular) PDF have been presented. Analog filter components of these circuits may be tuned based on ADC clock rate. Extension to triangular-distribution PDF dither generation spanning two LSBs that can be generated by introducing a second PRBS source to the proposed circuit has been described as well. Extension to a method of generating high-pass shaped dither by a digital filter with addition performed by a DAC has also been described.

CT residue generation systems with high-pass shaped dither, as described herein, or portions thereof (e.g., the dither generation circuits as described herein) may be included in any suitable system, device, or apparatus. For example, in some embodiments, any of the CT residue generation systems or portions thereof may be included in a pipeline ADC. In some embodiments, any of the CT residue generation systems or portions thereof may be included in a CT or a hybrid ADC. When used in an ADC, more than one of the CT residue generation systems as described herein may be implemented, e.g., by being cascaded. In other embodiments, any of the CT residue generation systems or portions thereof may be included in a larger system or device that is to perform analog-to-digital conversion. Other examples of systems and devices that include one or more of the CT residue generation systems as described herein are possible and within the scope of the disclosure.

Mechanisms described herein may be particularly applicable to CT residue generation stages within a multi-stage ADC. Examples of multi-stage ADCs include pipelined ADCs, and multi-stage noise shaping (MASH) ADCs. The multi-stage ADC may be entirely implemented with CT circuits. In some cases, the multi-stage ADC may be a hybrid continuous-time-discrete-time ADCs. The backend ADC2 106 may be implemented in according to various types of architectures, flash ADC, delta-sigma ADC, voltage-controlled-oscillator (VCO) based ADC, pipelined ADCs, MASH ADCs. Some of the mechanisms described herein may be especially attractive for high-performance and high-speed converter applications.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

As will be appreciated by one skilled in the art, aspects of the disclosure, in particular aspects of CT residue generation systems to implement high-pass shaped dither as proposed herein, may be embodied in various manners—e.g. as a method, a system, a computer program product, or a computer-readable storage medium. Accordingly, aspects of the disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the disclosure may take the form of a computer program product embodied in one or more computer-readable medium(s), preferably non-transitory, having computer-readable program code embodied e.g., stored, thereon. In various embodiments, such a computer program may, for example, be downloaded (updated) to the existing devices and systems (e.g., to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of CT residue generation systems to implement high-pass shaped dither, and systems in which such circuits may be implemented, details of these systems may be different in different embodiments. For example, various components of CT residue generation systems to implement high-pass shaped dither, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of CT residue generation systems to implement high-pass shaped dither presented herein (e.g., a residue generation circuit, etc.) and/or the particular arrangement of coupling connections (e.g., coupling connections between various components of CT residue generation systems to implement high-pass shaped dither as described herein, etc.) may be different in different embodiments, with the illustrations of the present drawings providing only some examples of how these components may be used together to realize CT residue generation systems to implement high-pass shaped dither. In yet another example, although some embodiments shown in the present drawings illustrate a certain number of components (e.g., a certain number of resistors shown in FIG. 7), it is understood that these embodiments may be implemented in a CT residue generation system implementing high-pass shaped dither or in any other devices or systems with any number of these components in accordance with the descriptions provided herein. Furthermore, although certain elements such as various elements of CT residue generation systems to implement high-pass shaped dither may be depicted in the drawings as communicatively coupled using a single depicted line in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner. Furthermore, for the purposes of the disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., an ADC circuit may be referred to simply as an "ADC," etc.). If used, the terms "substantially," "approximately," "about," "around," etc., may be used to generally refer to being within +/−20% of a target value, e.g., within +/−10% of a target value, based on the context of a particular value as described herein or as known in the art. While embodiments of the disclosure were described above with references to exemplary implementations as illustrated in the FIGURES, a person skilled in the art will realize that the various teachings described above are applicable to a large variety of other implementations.

In the discussions of the embodiments above, components of a system, such as e.g. combiners/adders, resistors, capacitors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the disclosure related to implementing one or more CT residue generation systems.

Parts of various CT residue generation systems to implement high-pass shaped dither as proposed herein can include electronic circuitry to perform the functions described herein. In some cases, one or more parts of the system can be provided by a processor specially for carrying out the functions described herein. For instance, the processor may include one or more application specific components, or may include programmable logic gates which are to carry out the functions describe herein. The circuitry can operate in analog domain, digital domain, or in a mixed-signal domain. In some instances, the processor may be to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry to perform a specific application or function) or implemented as plug-in modules into application specific hardware of electronic devices. Note that particular embodiments of the disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio-frequency (RF) functions: all of which may be provided on a single chip substrate. Other embodiments may include a multi-chip-module (MCM), with a plurality of separate ICs located within a single electronic package and to interact closely with each other through the electronic package.

All of the specifications, dimensions, and relationships outlined herein (e.g., the number of components of the CT residue generation systems to implement high-pass shaped dither, or portions thereof, shown in the present drawings, etc.) have only been offered for purposes of example and teaching only. Such information may be varied considerably without departing from the spirit of the disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Furthermore, functions related to implementing high-pass shaped dither in CT residue generation systems, as proposed herein, illustrate only some of the possible functions that may be executed by, or within, system illustrated in the present figures. Some of these operations may be deleted or removed where appropriate, or these operations may be modified or changed considerably without departing from the scope of the disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the disclosure encompass all such changes, substitutions, variations, alterations, and modifications as falling within the scope of the appended claims.

What is claimed is:

1. A continuous-time residue generation stage, comprising:
   a dither sequence generator to output a digital dither sequence;
   a dither signal processing part to receive the digital dither sequence and output a spectrally-shaped analog dither signal;

a forward path having a continuous-time filter to receive an analog input signal;
a feedforward path having a quantizer to receive the analog input signal and a digital-to-analog converter to receive a digital output of the quantizer, the quantizer having a node to sum the spectrally-shaped analog dither signal and the analog input signal; and
a filter to receive a residue signal and output a filtered residue signal, the residue signal based on an output signal of the forward path and an output signal of the feedforward path, wherein the spectrally-shaped analog dither signal is shaped away from pass-band frequencies of the filtered residue signal.

2. The continuous-time residue generation stage of claim 1, wherein the spectrally-shaped analog dither signal has an amplitude of one quantizer step of the quantizer, and a substantially uniform probability density function.

3. The continuous-time residue generation stage of claim 1, wherein the spectrally-shaped analog dither signal has an amplitude of two quantizer steps of the quantizer, and a substantially triangular probability density function.

4. The continuous-time residue generation stage of claim 1, wherein the filter has a low-pass filter response.

5. The continuous-time residue generation stage of claim 1, wherein the dither sequence generator is a 1-bit pseudorandom binary sequence generator.

6. The continuous-time residue generation stage of claim 1, wherein the dither sequence generator comprises a linear feedback shift register with storage elements.

7. The continuous-time residue generation stage of claim 1, wherein the dither sequence generator comprises multi-bit pseudorandom sequence generator.

8. The continuous-time residue generation stage of claim 1, wherein the dither sequence generator comprises two 1-bit pseudorandom binary sequence generators outputting two 1-bit pseudorandom binary sequences respectively, and the dither signal processing part comprises a node to sum two analog dither signals converted from the two 1-bit pseudorandom binary sequences to form the spectrally-shaped analog dither signal.

9. The continuous-time residue generation stage of claim 1, wherein the dither sequence generator comprises 2-bit pseudorandom binary sequence generator outputting a 2-bit pseudorandom binary sequence, and the dither signal processing part comprises a node to sum two analog dither signals converted from respective bits of the 2-bit pseudorandom binary sequence to form the spectrally-shaped analog dither signal.

10. The continuous-time residue generation stage of claim 1, wherein the dither signal processing part comprises:
a zero-order-hold circuit to receive the digital dither sequence and output an analog dither signal; and
an analog filter to receive the analog dither signal and output the spectrally-shaped analog dither signal.

11. The continuous-time residue generation stage of claim 1, wherein the dither signal processing part comprises:
a digital filter to receive the digital dither sequence and output a spectrally-shaped digital dither signal; and
a digital-to-analog converter to receive the spectrally-shaped digital dither signal and output the spectrally-shaped analog dither signal.

12. The continuous-time residue generation stage of claim 1, further comprising:
a digital filter to receive the digital dither sequence and output a filtered digital dither signal; and
circuitry to subtract the filtered digital dither signal from the digital output of the quantizer.

13. The continuous-time residue generation stage of claim 12, wherein the filtered digital dither signal is spectrally-shaped by the digital filter in an equivalent manner as the spectrally-shaped analog dither signal.

14. The continuous-time residue generation stage of claim 1, wherein the dither signal processing part comprises:
inverters to receive the digital dither sequence and output an analog dither signal; and
an analog filter having capacitive and resistive components to receive the analog dither signal and output the spectrally-shaped analog dither signal.

15. A continuous-time residue generation stage, comprising:
a dither sequence generator to generate a digital dither sequence;
a dither signal processing part to filter the digital dither sequence and generate a spectrally-shaped analog dither signal;
a forward path to delay an analog input signal;
a feedforward path having a quantizer and a digital-to-analog converter, the quantizer to sum the spectrally-shaped analog dither signal and the analog input signal, and to quantize the summed spectrally-shaped analog dither signal and the analog input signal; and
a filter to filter a residue signal generated from outputs of the forward path and the feedforward path, wherein the spectrally-shaped analog dither signal is shaped away from pass-band frequencies of the filtered residue signal.

16. The continuous-time residue generation stage of claim 15, the dither signal processing part implements scaling to generate the spectrally-shaped analog dither signal having a predetermined amplitude.

17. A method to reduce spurs caused by quantization error in a continuous-time residue generation stage, comprising:
in a forward path, delaying an analog input signal;
in a feedforward path,
injecting a spectrally-shaped analog dither signal at an input of a quantizer,
quantizing a summed spectrally-shaped analog dither signal and the analog input signal, and
generating a reconstructed version of the analog input signal based on the quantizing;
generating a residue signal based on the delayed analog input signal and the reconstructed version of the analog input signal;
filtering the residue signal, and
shaping a dither signal away from pass-band frequencies of the filtering of the residue signal to generate the spectrally-shaped analog dither signal.

18. The method of claim 17, further comprising:
removing a further spectrally-shaped analog dither signal from the feedforward path after the quantizing.

19. The method of claim 17, further comprising:
scaling a dither sequence or a dither signal to generate the spectrally-shaped analog dither signal having a predetermined amplitude.

20. The method of claim 17, further comprising:
generating a digital dither sequence; and
filtering an analog version of the digital dither sequence.

* * * * *